United States Patent [19]

Dufresne et al.

[11] Patent Number: 4,495,545
[45] Date of Patent: Jan. 22, 1985

[54] ENCLOSURE FOR ELECTRICAL AND ELECTRONIC EQUIPMENT WITH TEMPERATURE EQUALIZATION AND CONTROL

[75] Inventors: Gilles L. Dufresne, Aylmer; George V. Devlin, Nepean; Alexander F. Campbell, Woodlawn; David Campbell, Nepean, all of Canada

[73] Assignee: Northern Telecom Limited, Montreal, Canada

[21] Appl. No.: 476,940

[22] Filed: Mar. 21, 1983

[51] Int. Cl.³ .............................................. H05K 7/20
[52] U.S. Cl. .................................................. 361/384
[58] Field of Search ............ 361/383, 384; 174/16 R; 165/39, 40; 98/33 A; 336/59; 236/49; 219/365, 368, 378; 310/59, 62, 63

[56] References Cited

U.S. PATENT DOCUMENTS

| | | | |
|---|---|---|---|
| 2,459,322 | 1/1949 | Johnston | 336/59 |
| 2,610,567 | 9/1952 | Davis | 98/33 A |
| 2,927,736 | 3/1960 | Rohatyn | 236/49 |
| 3,015,217 | 1/1962 | Beemer et al. | 236/49 |
| 3,253,646 | 5/1966 | Koltuniak et al. | 165/39 |
| 3,951,336 | 4/1976 | Miller et al. | 236/49 |

*Primary Examiner*—Reinhard J. Eisenzopf
*Assistant Examiner*—Gregory D. Thompson
*Attorney, Agent, or Firm*—Sidney T. Jelly

[57] ABSTRACT

An enclosure for electrical equipment is arranged in sections, typically vertical and with an equipment mounting section at the front and an air passage section at the rear. Air is constantly circulated through the two sections, in a closed loop, to maintain an even temperature and avoid hotspots in the enclosure. At the top, one or more fans are positioned over each section, and an air inlet and an air outlet are provided. A pivotal baffle has two positions. In one it shuts off access to the inlet and outlet and permits the closed circulation of air. In the other position it shuts off circulation between sections at one end and opens access to the inlet and outlet, giving an air circulation from the inlet, through the sections and out of the outlet. An additional fan can be switched on for the latter form of circulation.

10 Claims, 5 Drawing Figures

4,495,545

ENCLOSURE FOR ELECTRICAL AND ELECTRONIC EQUIPMENT WITH TEMPERATURE EQUALIZATION AND CONTROL

This invention relates to enclosures for electrical and electronic equipment, such as are used in communications systems. In particular the invention relates to the temperature equalization and control of the atmosphere in such enclosures.

BACKGROUND OF THE INVENTION

Electrical and electronic equipment produce a fair amount of heat during the operation of the equipment. Depending upon the type of equipment, and its usage, some positions may heat up more than others, and these positions may move within the enclosure. Also, the heat produced can eventually cause a rise in temperature above that considered acceptable. These conditions of varying temperature positions or zones within the enclosure, and overall temperature are also affected by ambient conditions outside the enclosure.

BRIEF SUMMARY OF THE INVENTION

The invention provides a forced air circulation system in the enclosure which has two alternative patterns or modes. In one pattern or mode, the air within the enclosure is circulated, by one or more fans, in a continuous closed circulatory pattern. This reduces hot spots in the enclosure to result in a more uniform temperature profile throughout the enclosure. In the alternative pattern or mode, air is drawn in from outside the enclosure by one or more fans, circulated through the enclosure and exhausted from the enclosure by further one or more fans. One fan, or set of fans, operates continuously, the other fan, or set of fans, operates intermittently when the air is being drawn in from outside and exhausted to outside. A pivotally mounted baffle is provided to direct the air either to continuous circulation within the enclosure or the intake and exhaust pattern. A heat responsive motor, or transducer, is used to activate the baffle. There is a short period of transition between closed circulation or open circulation, which period will vary depending upon various factors.

In its broadest aspect the invention comprises, for an enclosure for electrical and electronic equipment, at least one fan for continuously circulating air within the enclosure, at least one further fan for causing air to be circulated from an air inlet to an air exhaust, through the enclosure, a baffle pivotal to one or other of two positions to give continuous circulation or circulation from the inlet to the exhaust, and heat responsive means for moving the baffle from a continuous circulation position to the alternative position, movement of the baffle also switching on one of the fans.

In a particular embodiment, the fan causing continuous circulation operates all the time, the other fan switching on when the baffle is moved to the alternative position, to propel air to exhaust.

The invention will be readily understood by the following description of an embodiment, by way of example in conjunction with the accompanying drawings, in which:

BRIEF DESCRIPTION OF THE DRAWINGS

FIGS. 1 and 2 illustrate the invention very diagrammatically. An enclosure 10 is illustrated, in cross-section, the cross-section being from front to back. One or more doors 11 close the front of the enclosure and one or more bays of electronic equipment are mounted on pivotal frames, at 12. The enclosure will usually have one or two doors, pivoted at a side of the enclosure, and one or more bays of equipment. The equipment enclosure may itself vary in size.

The enclosure is divided vertically into two sections by a transverse wall 27, the front section in which are positioned the bays 12 and a rear section 13 which forms an air passage. At the base a space for batteries can be provided, at 14.

Figure 5:
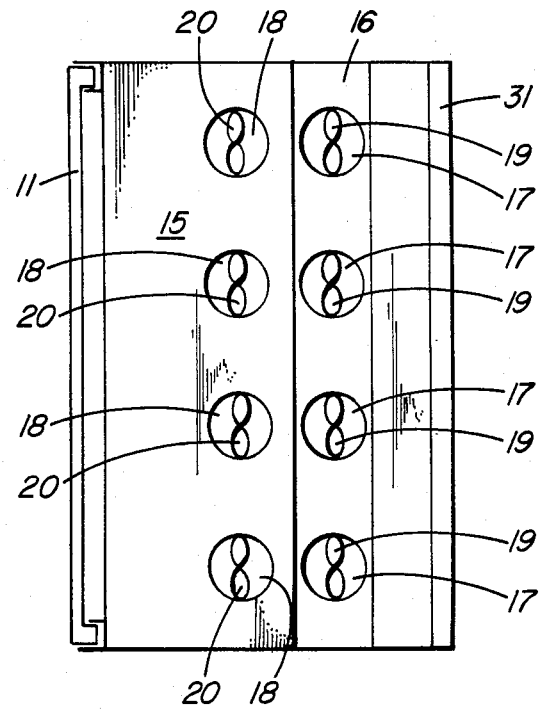
FIG. 5 is a cross-sectional view taken along line V—V of FIG. 2.

Extending across the enclosure, at the top, is a ceiling member 15. Formed in the ceiling is an elongate opening or trough 16 having apertures 17 at its base. Also formed in the ceiling is a series of apertures 18. Apertures 17 are above the air passage 13 and apertures 18 are above the bays 12. In an example four apertures 17 and four apertures 18 are spaced across the enclosure. In each aperture is mounted an electric fan, 19 and 20, as illustrated in FIG. 5.

Mounted above the apertures 17 and opening or trough 16 is a baffle 21. The baffle is pivotally mounted at 22 and conveniently extends as a continuous member for substantially the width of the enclosure, that is over all apertures 17 and 18 and over the trough 16. The baffle has three sections 23, 24 and 25.

Figure 1:
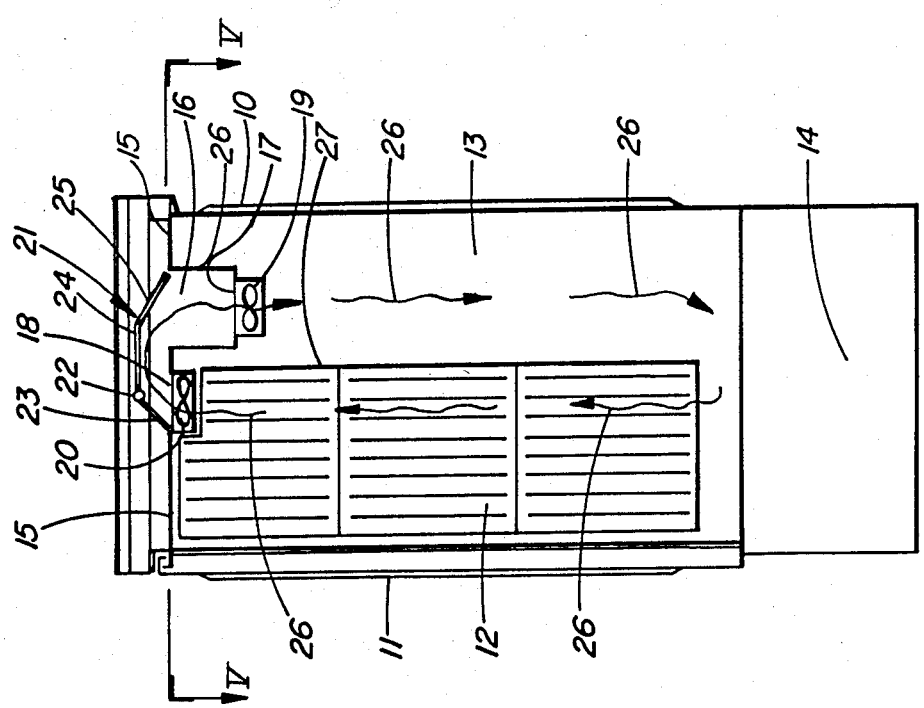

Section 23, hereinafter referred to as the front section, extends from the pivot forward and is inclined downward, as illustrated in FIG. 1, from section 24, referred to as the center section. The center section is substantially horizontal in the position of the baffle in FIG. 1, extending rearwardly from the pivot 22. Section 25, the rear section, is inclined downwardly and rearwardly from the rear edge of the center section. The baffle pivots from the position shown in FIG. 1 to the position shown in FIG. 2.

In the position shown in FIG. 1, the front edge of the front section 23 is in contact with the ceiling 15. The rear edge of the rear section 25 is in contact with the rear edge of opening or trough 16. With the baffle in this position, continuous circulation of air through the enclosure is obtained, by operation of fans 19. The circulation is indicated by the arrows 26.

Figure 2:
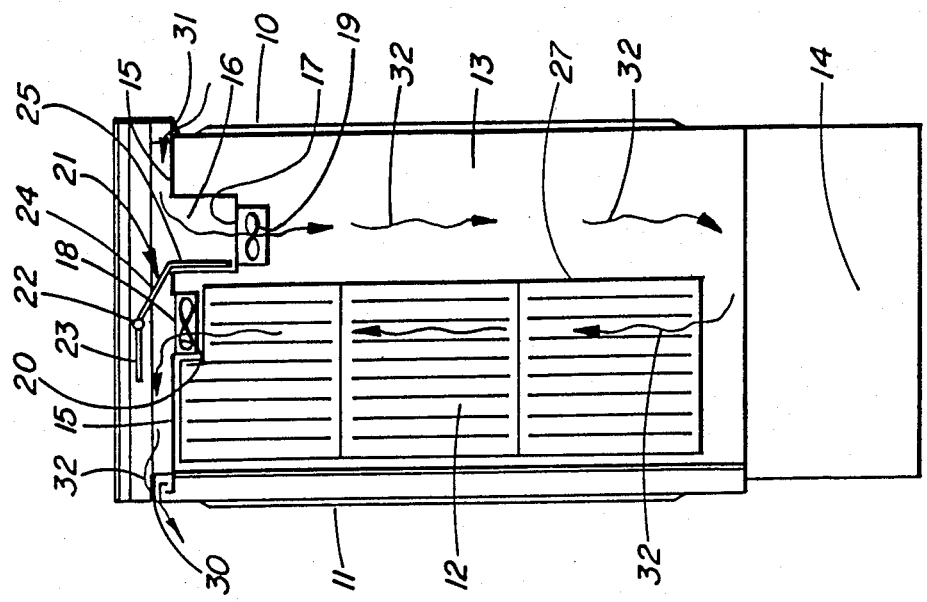
FIGS. 1 and 2 are diagrammatic cross-sections through an enclosure, the sections extending from front to back.

In the position shown in FIG. 2, the front section 23 of the baffle rests up close to the top of the enclosure, while the rear section extends down into the trough 16, adjacent to the forward side of the trough. Air now flows through fans 20 across the top of the enclosure and exhaust through outlets in the top front edge at 30. In this position of the baffle fans 19 and 20 are operating and air is drawn in through inlets in the top rear edge at 31. Circulation is as indicated by arrows 32. The fans 20 are switched on by the pivoting of the baffle 21.

Various changes can be made in the above arrangement. Thus fans 20 can be operated continuously and the fans 19 switched on when the baffle pivots to the position as in FIG. 2. Different forms of baffle can be used and the particular arrangement of the apertures 17 and 18 and fans 19 and 20 can vary. The temperature at which the baffle is actuated can also be varied.

Figure 3:
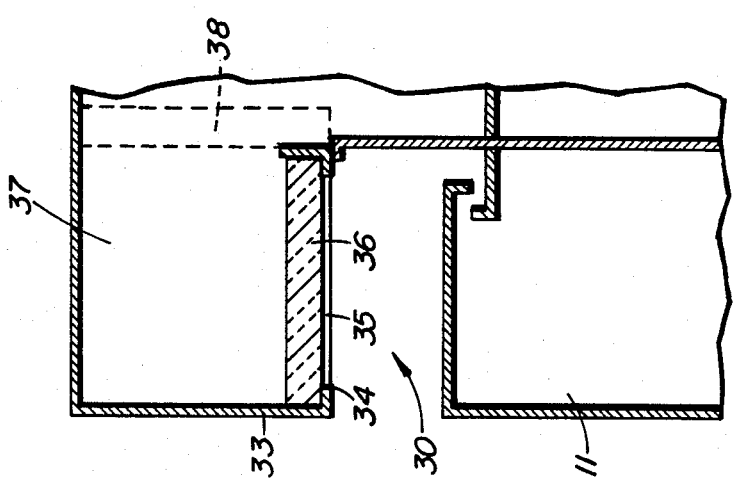
FIG. 3 is an enlarged section of an air outlet.

FIG. 3 illustrates one form of exhaust outlet as at 30. A similar arrangement is provided for the inlet at 31. The top of the enclosure has a downwardly extending outer wall 33 and an inwardly extending flange 34 at the bottom edge of the wall 33. A plurality of slots 35 are formed in the flange 34, and a filter 36 rests over the slots, resting on the flange 34. The top of the enclosure, indicated generally at 37, can be arranged to pivot up, for example being hinged at the rear. An alternative filter position is indicated in dotted outline at 38.

The baffle is pivoted by a heat responsive device, such as is used to open and close windows in a greenhouse. The device is a self-contained transducer, which expands in length with rising temperature. As an example, the baffle remains in the position as in FIG. 1 until the temperature in the enclosure reaches about 27° C. The transducer then starts to pivot the baffle until, at about 32° C. the baffle is in the position as in FIG. 2. When the enclosure temperature falls, the reverse action occurs. The baffle can be resiliently biased to the position as in FIG. 1 by one or more springs.

Figure 4:
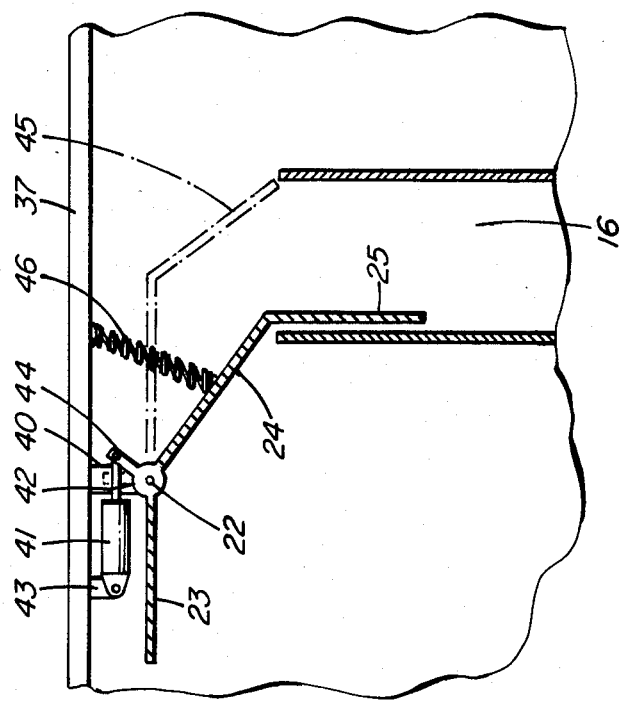
FIG. 4 is a diagrammatic illustration of one form of heat responsive means.

FIG. 4 illustrates very diagrammatically one form of heat responsive device. The pivot 22 of the baffle is supported on brackets attached to the top of the enclosure, one bracket indicated at 40. The heat responsive device comprises a cylinder 41 and a moveable rod 42. The cylinder 41 is mounted at one end on a bracket 43 attached to the top of the enclosure, the rod 42 extending from the other end of the cylinder and being attached to a short lever or extension 44 on the pivot 22. Increase in temperature causes expansion of a material inside the cylinder, pushing the rod. In FIG. 4 the device is shown in the expanded mode, the baffle being as in FIG. 2. In the collapsed mode, the baffle returns to the position as in FIG. 1 and indicated in FIG. 4 by dotted outline 45. The baffle is biased to return to the position as in FIG. 1, on collapse of the device, by a spring, which can be inside the cylinder, or by a spring, as indicated diagrammatically at 46.

The invention provides a more uniform temperature within the enclosure. This results in an efficient operation of the equipment.

What is claimed is:

1. An enclosure for electrical equipment, said enclosure including two sections side by side and interconnected at each end;
   an air inlet connected to one section at one end;
   an air outlet connected to the other section at said one end;
   a pivotally mounted baffle at said one end, moveable alternately to one of a first position and a second position; the baffle isolating said sections from said inlet and outlet and permitting connection between sections at said one end in said first position for continuous circulation through both sections, the baffle preventing connection between sections at said one end opening said sections to said inlet and outlet in said second position for circulation from said inlet through said sections to said outlet;
   a first fan operable to continuously circulate air through said sections when said baffle is in said first position;
   a second fan operable when said baffle is in said second position, to assist in circulating air from said inlet to said outlet through said sections;
   heat responsive means to move said baffle from said first position to said second position when the temperature in said enclosure exceeds a predetermined value.

2. An enclosure as claimed in claim 1, said sections extending vertically and interconnected at top and bottom ends.

3. An enclosure as claimed in claim 2, said baffle mounted at the top of the enclosure.

4. An enclosure as claimed in claim 2, said sections comprising a front section and a rear section, electrical equipment being mounted in said front section, said rear section defining an air passage.

5. An enclosure as claimed in claim 3, said fans mounted adjacent to the baffle.

6. An enclosure as claimed in claim 4, including a ceiling member extending across the enclosure spaced down from the top of the enclosure, a trough extending in the ceiling member over said rear section, and at least one aperture in the base of the trough, a fan positioned in said aperture to feed air into said rear section, at least one aperture in said ceiling member above said front section and a fan positioned in said aperture for extracting air from said front section, an opening in said ceiling member permitting connection between said front and rear sections.

7. An enclosure as claimed in claim 6, including a plurality of apertures in the base of the trough and extending across the rear section, a fan in each aperture; and a plurality of apertures in said ceiling member and extending across the front section, a fan in each aperture.

8. An enclosure as claimed in claim 6, said baffle mounted at the top of the enclosure, above said ceiling member, the inlet and outlet being positioned above said ceiling member the outlet at the front and the inlet at the rear, the baffle including a front section which, in said first position, extending between the top of the housing and the ceiling member to prevent access to the air outlet and permitting air flow from said front section back to said rear section, the baffle also including a rear section which, in said first position extends down from the top of the enclosure to said ceiling member to prevent access to the air inlet; said front section of said baffle in said second position permitting access to said air outlet, said rear section of said baffle in said second position permitting access to the air inlet for air to flow to said trough and said apertures in the base of the trough, and preventing air flow from said front section to said rear section.

9. An enclosure as claimed in claim 6, said fan in said aperture in the base of said trough arranged for continuous operation, said fan in said aperture in said ceiling member when said baffle is in said second position.

10. An enclosure as claimed in claim 7, said fans in said apertures in the base of the trough arranged for continuous operation, said fans in said apertures in said ceiling member in operation when said baffle is in said second position.

* * * * *